US008883533B2

(12) United States Patent
Lin et al.

(10) Patent No.: US 8,883,533 B2

(45) Date of Patent: Nov. 11, 2014

(54) METHOD FOR MANUFACTURING LIGHT EMITTING DIODE PACKAGE

(75) Inventors: Hsin-Chiang Lin, Hsinchu (TW); Pin-Chuan Chen, Hsinchu (TW); Lung-Hsin Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 35 days.

(21) Appl. No.: 13/571,361

(22) Filed: Aug. 10, 2012

(65) Prior Publication Data

US 2013/0217159 A1 Aug. 22, 2013

(51) Int. Cl.
*H01L 21/00* (2006.01)

(52) U.S. Cl.
USPC .................. 438/42; 438/29; 438/31; 257/91; 257/98; 257/99; 257/E33.068; 257/E33.069; 257/E33.072

(58) Field of Classification Search
USPC ..................... 438/28, 29, 31; 257/91, 98, 99, 257/E33.068, E33.069, E33.072
See application file for complete search history.

(56) References Cited

U.S. PATENT DOCUMENTS

| | | | | |
|---|---|---|---|---|
| 2006/0261360 | A1 | 11/2006 | Takehashi et al. | |
| 2007/0080360 | A1* | 4/2007 | Mirsky et al. | 257/99 |
| 2010/0187556 | A1* | 7/2010 | Kim et al. | 257/98 |
| 2012/0097986 | A1* | 4/2012 | Ku et al. | 257/88 |

FOREIGN PATENT DOCUMENTS

| | | | |
|---|---|---|---|
| CN | 101322254 | A | 12/2008 |
| JP | 2007300018 | A | 11/2007 |
| JP | 2008187053 | A | 8/2008 |
| JP | 2009182307 | A | 8/2009 |
| TW | I256737 | | 6/2006 |
| WO | 2007049938 | A1 | 5/2007 |

* cited by examiner

*Primary Examiner* — Su Kim
(74) *Attorney, Agent, or Firm* — Novak Druce Connolly Bove + Quigg LLP

(57) ABSTRACT

A method for manufacturing an LED package comprising steps of: providing a substrate and forming spaced electrode structures on the substrate; providing a mold on the top surface of the substrate wherein the mold defines spaced annular grooves which cooperate with the top surface of the substrate to define cavities; filling the cavities with metal material; removing the mold and hardening the metal material to form reflection cups wherein each reflection cup surrounds a corresponding electrode structure and defines a recess; polishing surfaces of the reflection cups and the electrode structures; arranging LED chips in the recesses with each LED chip electrically connected to the electrode structure; injecting an encapsulation layer in the recesses to seal the LED chips; and cutting the substrate to obtain individual LED packages.

18 Claims, 14 Drawing Sheets

400 300 201 200 20 10 111 112 11

METHOD FOR MANUFACTURING LIGHT EMITTING DIODE PACKAGE

BACKGROUND

1. Technical Field

The present disclosure relates to a method for manufacturing a light emitting diode (LED) package, and particularly to a method for manufacturing an LED package which has a reflection cup made of metal material.

2. Description of Related Art

LEDs have been widely promoted as a light source of electronic devices owing to many advantages, such as high luminosity, low operational voltage and low power consumption. However, the LED chip should be packaged before used in various fields, to obtain higher luminous efficiency and longer service life. In an LED package, a reflection cup is generally required to reflect light emitted by the LED chip. The reflection cup is generally made of plastic or ceramic. However, the reflection cup made of plastic is easily to be oxidized and becomes yellow under high temperature. Besides, due to poor light reflective performance, the reflection cup made of ceramic needs to be coated with a reflective material by electroplating or spraying process, which is relatively complex.

Therefore, a method for manufacturing an LED package capable of overcoming the above described shortcomings is desired.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Referring to FIGS. 1-13, a method for manufacturing an LED package 100 in accordance with an embodiment of the present disclosure is shown. The method mainly includes steps as described below.

Figure 1:
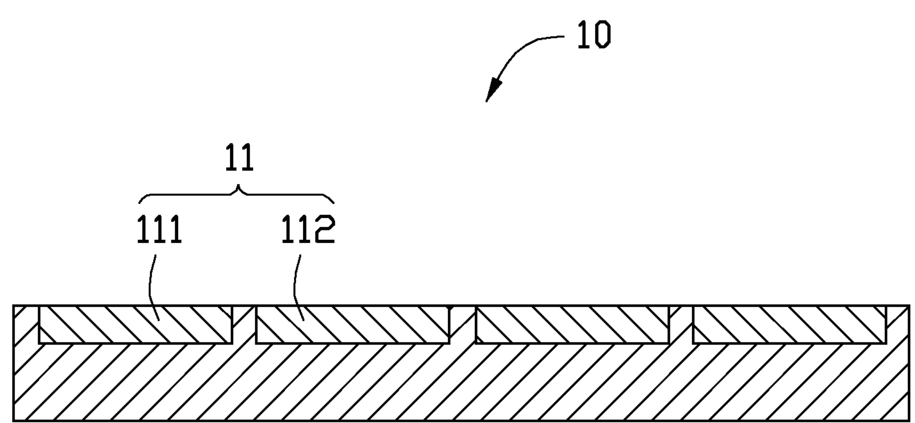
FIGS. 1-2 are schematic, cross-sectional views showing first and second steps of a method for manufacturing an LED package in accordance with an embodiment of the present disclosure.

As shown in FIG. 1, a substrate 10 is provided. The substrate 10 includes a plurality of spaced electrode structures 11 formed in a top surface thereof, and each electrode structure 11 includes a first electrode 111 and a second electrode 112 spaced from the first electrode 111. The substrate 10 is made of silicon or ceramic, and the electrode structure 11 is made of an electrically conducting material.

Figure 2:
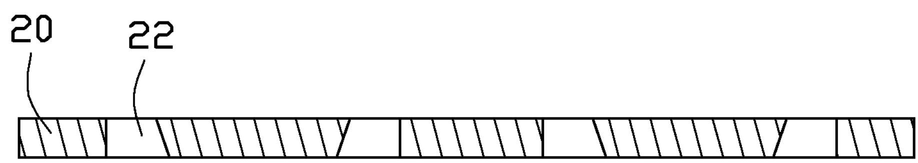
Figure 3:
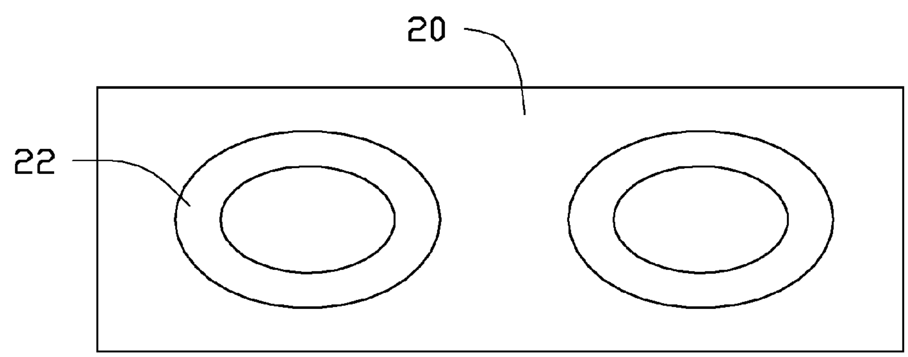
FIG. 3 is a schematic, top view of a mold used in the method of FIG. 2.
Figure 4:
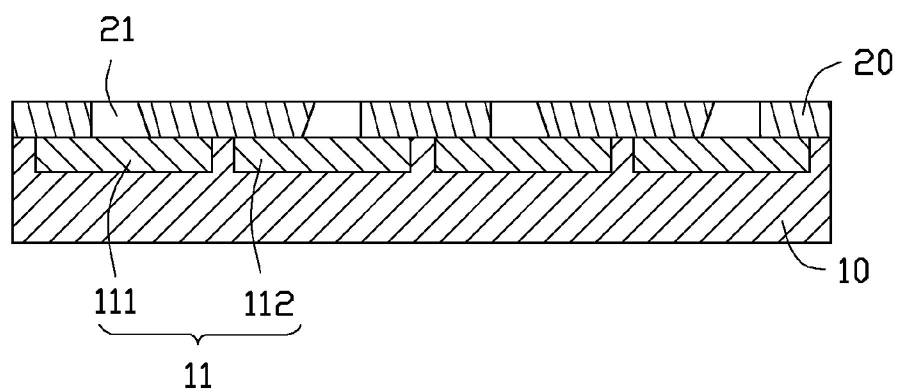
FIGS. 4-13 are schematic, cross-sectional views showing other steps of the method.

As shown in FIGS. 2-4, a mold 20 is provided on the top surface of the substrate 10. The mold 20 defines a plurality of spaced annular grooves 22, and the top surface of the substrate 10 is exposed upwardly via the annular grooves 22. So, the mold 20 and the top surface of the substrate 10 cooperatively define a plurality of cup-like cavities 21, as viewed from FIG. 4.

Figure 5:
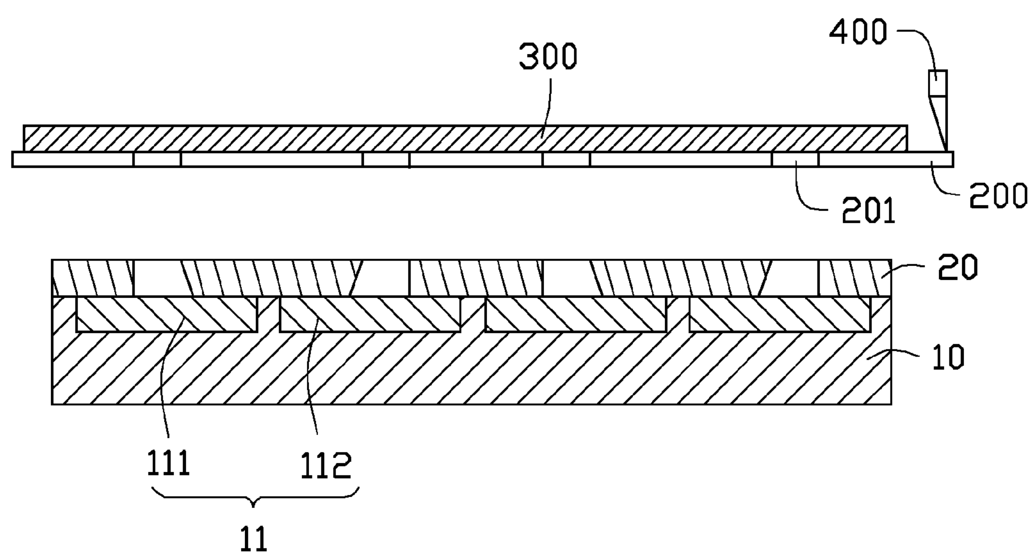

As shown in FIG. 5, a stencil 200 and a metal material 300 are provided. The stencil 200 is a flat film, and defines a plurality of spaced through holes 201 therein. Each of the through holes 201 corresponds to one cavity 21. In this embodiment, the metal material 300 is a mixture of glue, silver powder and glass material. In addition, the metal material 300 can also have other metal powder mixed therein.

Figure 6:
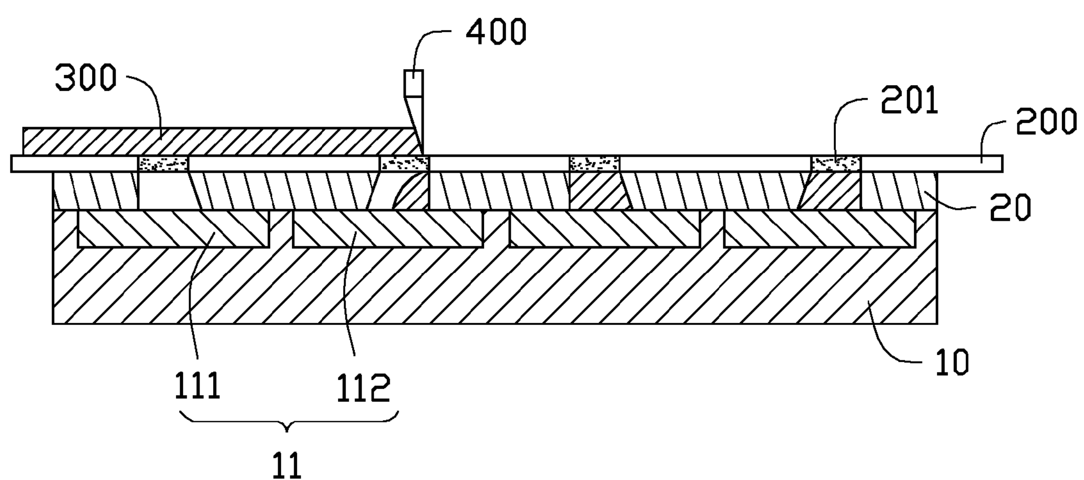
Figure 7:
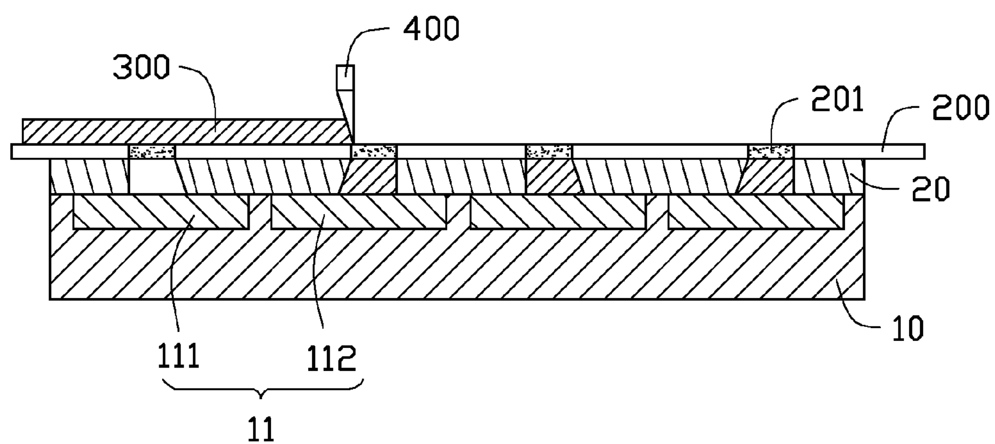

As shown in FIGS. 6 and 7, firstly, the stencil 200 is put on the mold 20, with the through holes 201 in communication with the cavities 21 correspondingly. Secondly, the metal material 300 is put on the stencil 200. Then, a scraper 400 is provided to scrape along the stencil 200, and accordingly the metal material 300 on the stencil 200 is filled into the cavities 21 via the through holes 201 by the scraper 400.

Figure 8:
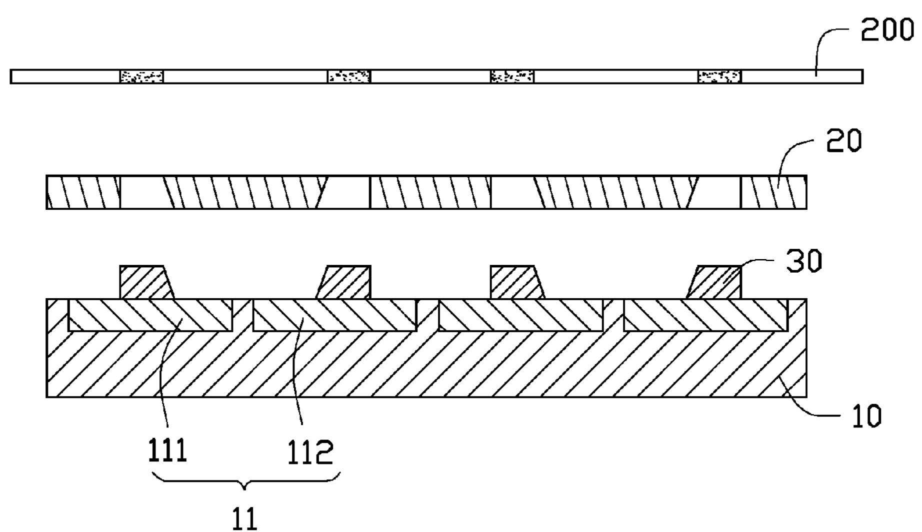

As shown in FIG. 8, the stencil 200 and the mold 20 are removed.

Figure 9:
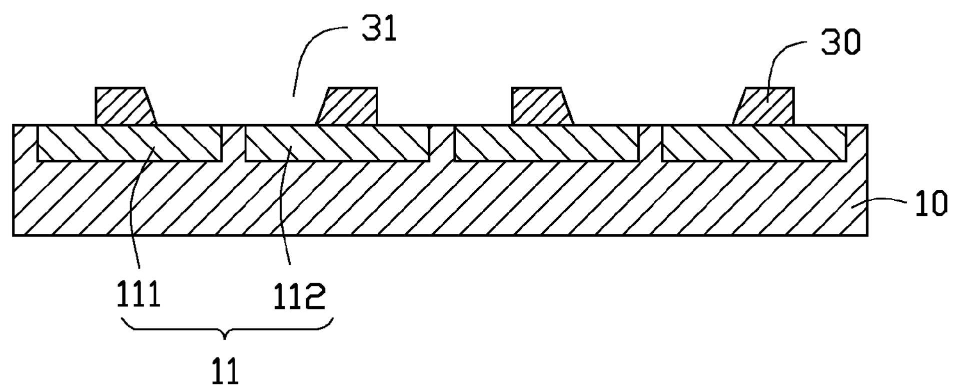

As shown in FIG. 9, the metal material 300 is hardened, so a plurality of reflection cups 30 are formed. Each of the reflection cups 30 is located on a corresponding electrode structure 11, and defines a recess 31 therein. The metal material 300 can be hardened by sintering or baking the metal material 300.

Figure 10:
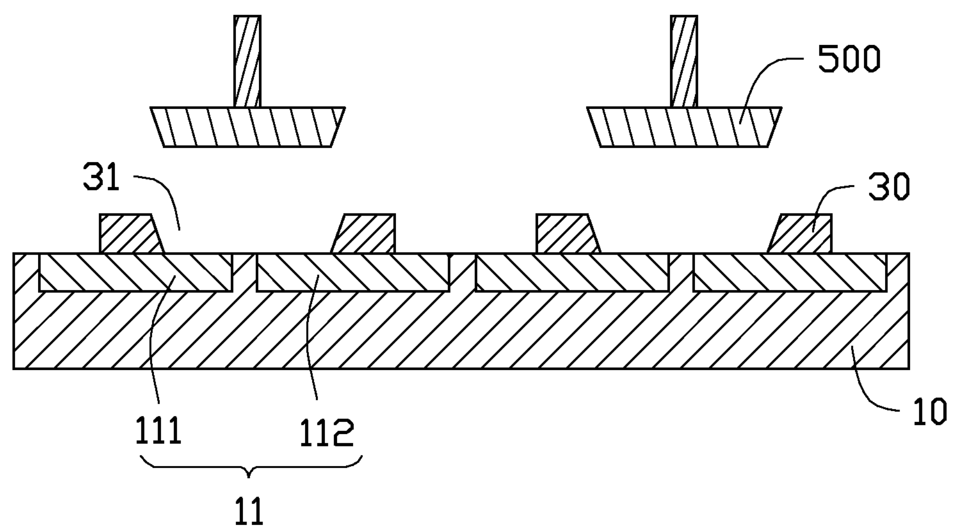
Figure 14:
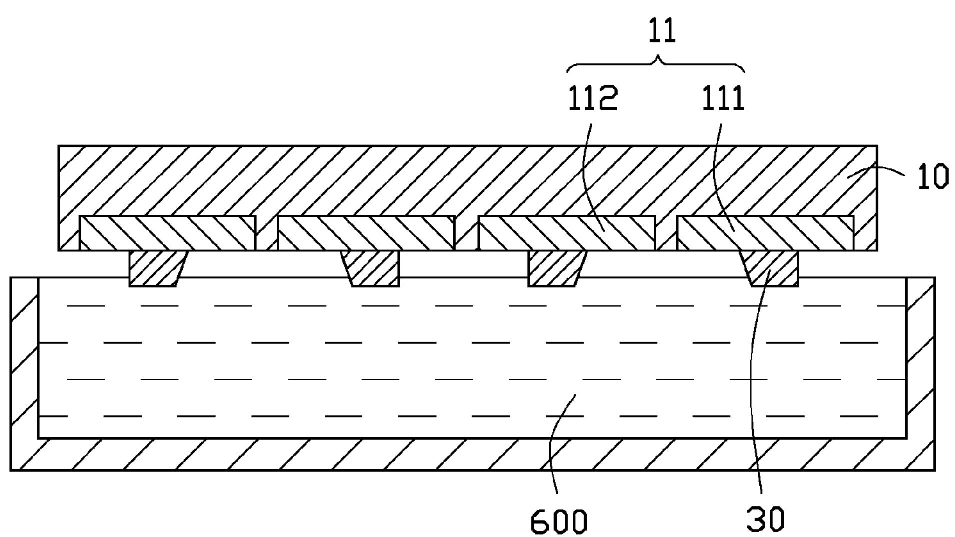
FIG. 14 is a schematic, cross-sectional view showing that a reflection cup and a substrate are polished in a manner in accordance with an alternative embodiment of the method of the present disclosure.

Surfaces of the reflection cups 30 and the substrate 10 are polished. As shown in FIG. 10, surfaces of the reflection cups 30 and the substrate 10 can be polished by grinding wherein a grinding tool 500 is used. Alternatively, as shown in FIG. 14, surfaces of the reflection cup 30 and the substrate 10 can be polished by etching. In the process of etching, the substrate 10 is inverted whereby the reflection layer 30 and the electrode structure 11 can be conveniently immersed in etching fluid.

Figure 11:
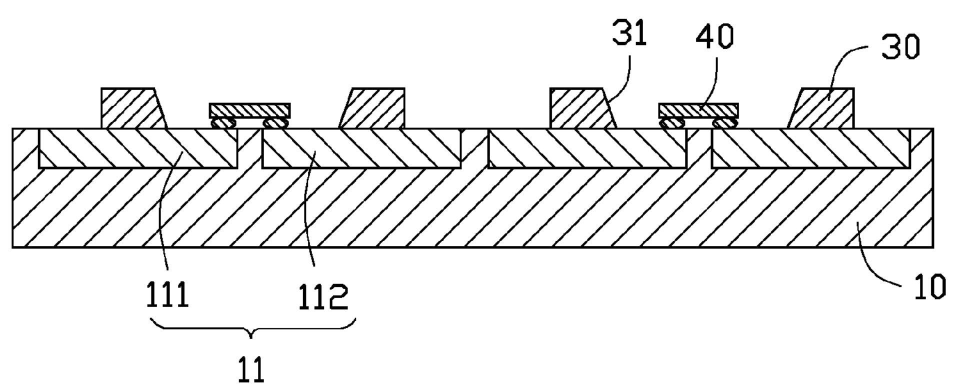

As shown in FIG. 11, at least one LED chip 40 is provided on the electrode structure 11 in the recess 31 of each reflection cup 30. Each LED chip 40 is electrically connected to the first electrode 111 and the second electrode 112 respectively by flip-chip. Alternatively, each LED chip 40 can also be electrically connected to the first electrode 111 and the second electrode 112 respectively by wire bonding. The electrode structure 11 can be electrically connected to an external circuit, such as a PCB, to transfer external power to the LED chip 40.

Figure 12:
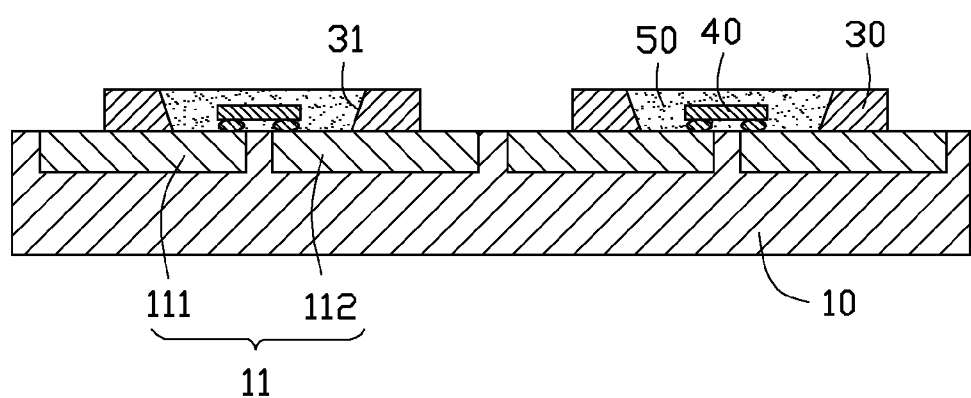

As shown in FIG. 12, an encapsulation 50 is provided in the recess 31 of each reflection cup 30 to seal a corresponding LED chip 40. In this embodiment, the encapsulation 50 is injected into the recess 31 by glue-dispensing processing. The encapsulation 50 is then pressed by a mold (not shown) until a top of the encapsulation 50 is coplanar with a top of the reflection layer 30, whereby the recess 31 of each reflection cup 30 is completely filled with the encapsulation 50. In addition, a phosphor (not shown) can be mixed in the encapsulation 50 to obtain a desired color of light of the LED package 100.

Figure 13:
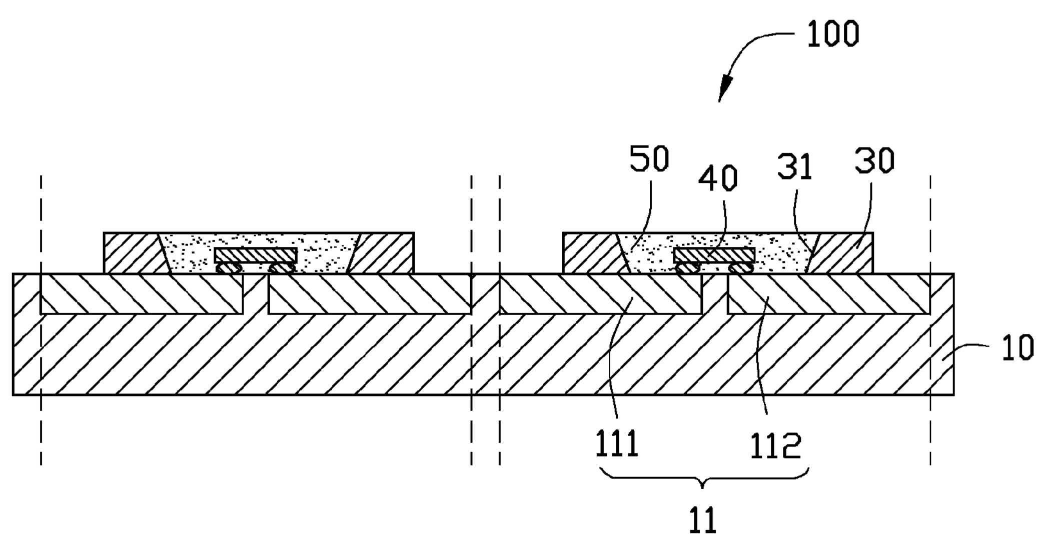

As shown in FIG. 13, the substrate 10 is cut to obtain a plurality of individual LED packages 100. Each of the LED packages 100 includes a substrate 10 with an electrode structure 11, an LED chip 40 electrically connecting with the electrode structure 11, a reflection cup 30 surrounding the LED chip 40 and an encapsulation 50 sealing the LED chip 40.

Additionally, the stencil 200 can be omitted; in this situation, the metal material 300 is filled to the cavity 21 directly.

The above mentioned method is easy and convenient. The reflection cup 30 of the LED package 100 manufactured by the method has a good light reflective ability, and will not be oxidized and become yellow under high temperature.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A method for manufacturing an LED (light emitting diode) package, comprising steps:

providing a substrate, forming a plurality of spaced electrode structures on a top surface of the substrate, each electrode structure comprising a first electrode and a second electrode spaced from the first electrode;

providing a mold on the top surface of the substrate, the mold defining a plurality of spaced annular grooves, the annular grooves and the top surface of the substrate cooperatively defining a plurality of cup-like cavities;

filling the cavities with metal material;

removing the mold and hardening the metal material to form a plurality of reflection cups, each reflection cup corresponding to an electrode structure and defining a recess therein;

polishing surfaces of the reflection cups;

arranging at least one LED chip in the each recess and electrically connecting the at least one LED chip to the first electrode and the second electrode;

injecting an encapsulation layer in the recesses to seal the LED chips; and cutting the substrate to obtain a plurality of individual LED packages each comprising at least a corresponding reflection cup and a corresponding at least one LED chip.

2. The method of claim 1, wherein the substrate is made of silicon or ceramic.

3. The method of claim 1, wherein the step of filling the cavity with metal material comprises steps:

providing a stencil, the stencil defining a plurality of spaced through holes therein;

putting the stencil on the mold, with the through holes in communication with the cavities correspondingly; and providing the metal material on the stencil, and filling the metal material into the cavities via the through holes of the stencil.

4. The method of claim 1, wherein the metal material is a mixture of glue, silver powder and glass material.

5. The method of claim 1, wherein the metal material is hardened by sintering or baking.

6. The method of claim 1, wherein the reflection cups are polished by grinding.

7. The method of claim 1, wherein the reflection cups are polished by etching.

8. The method of claim 1, wherein the at least one LED chip is electrically connected to the first electrode and the second electrode by flip-chip or wire bonding.

9. A method for manufacturing an LED package, comprising steps of:

providing a substrate, forming a plurality of spaced electrode structures on a top surface of the substrate, each electrode structure comprising a first electrode and a second electrode spaced from the first electrode;

providing a mold on the top surface of the substrate, the mold defining a plurality of spaced annular grooves, the annular grooves and the top surface of the substrate cooperatively defining a plurality of cup-like cavities;

providing a stencil, the stencil defining a plurality of spaced through holes therein;

putting the stencil on the mold with the through holes in communication with the cavities correspondingly;

providing metal material on the stencil, and filling the metal material into the cavities via the through holes of the stencil;

removing the mold and hardening the metal material to form a plurality of reflection cups, each reflection cup corresponding to an electrode structure and defining a recess therein;

polishing surfaces of the reflection cups;

arranging an LED chip in each of the recesses and electrically connecting the LED chip to the first electrode and the second electrode;

injecting an encapsulation layer in the recesses to seal the LED chips.

10. The method of claim 9, wherein the substrate is made of silicon or ceramic.

11. The method of claim 10, wherein the metal material is a mixture of glue, silver powder and glass material.

12. The method of claim 11, wherein the metal material is hardened by sintering or baking.

13. The method of claim 9, wherein the reflection cups are polished by grinding.

14. The method of claim 9, wherein the reflection cups are polished by etching.

15. The method of claim 9, wherein the LED chip is electrically connected to the first electrode and the second electrode by flip-chip or wire bonding.

16. The method of claim 9, further comprising a step of cutting the substrate to obtain a plurality of individual LED packages each including at least the LED chip and a corresponding reflection cup.

17. The method of claim 6, wherein a grinding tool is provided to grind the top substrate and the reflection cups.

18. The method of claim 13, wherein a grinding tool is provided to grind the top substrate and the reflection cups.

* * * * *